United States Patent [19]

Dieu

[11] Patent Number: 4,484,140
[45] Date of Patent: Nov. 20, 1984

[54] BATTERY SCANNING SYSTEM
[75] Inventor: Lloyd F. Dieu, Poulsbo, Wash.
[73] Assignee: The United States of America as represented by the Secretary of the Navy, Washington, D.C.
[21] Appl. No.: 371,043
[22] Filed: Apr. 23, 1982
[51] Int. Cl.³ ............................................. G01N 27/46
[52] U.S. Cl. ................................... 324/434; 324/435; 320/43
[58] Field of Search ....................... 324/426, 434, 435; 320/15, 17, 43; 340/636

[56] References Cited
U.S. PATENT DOCUMENTS

| | | | |
|---|---|---|---|
| 3,487,295 | 12/1969 | Nocera et al. | 324/29.5 |
| 3,786,343 | 1/1974 | Ehlers | 324/434 |
| 3,879,654 | 4/1975 | Kessinger | 324/29.5 |
| 4,044,300 | 8/1977 | Dupuis et al. | 324/29.5 |
| 4,053,824 | 10/1977 | Dupuis et al. | 324/29.5 |
| 4,134,060 | 1/1979 | Feldman | 324/29.5 |
| 4,280,097 | 7/1981 | Carey et al. | 324/434 |

Primary Examiner—Michael J. Tokar
Assistant Examiner—Kevin D. O'Shea
Attorney, Agent, or Firm—R. F. Beers; D. B. Curry

[57] ABSTRACT

A battery scanning system which is capable of monitoring and displaying the voltage of each cell in a battery or upon command provides the cell voltage distribution by displaying the cell number and voltage value of highest and lowest cell. The system has a digital logic system, display, input switches for operator generated variables, an alarm, relays, relay selection gates, an optically coupled isolation amplifier, power source and an analog-digital converter. The optically coupled analog amplifier electrically isolates the system from the battery so that large voltage offsets will not adversely affect the automatic measuring of the cells.

8 Claims, 8 Drawing Figures

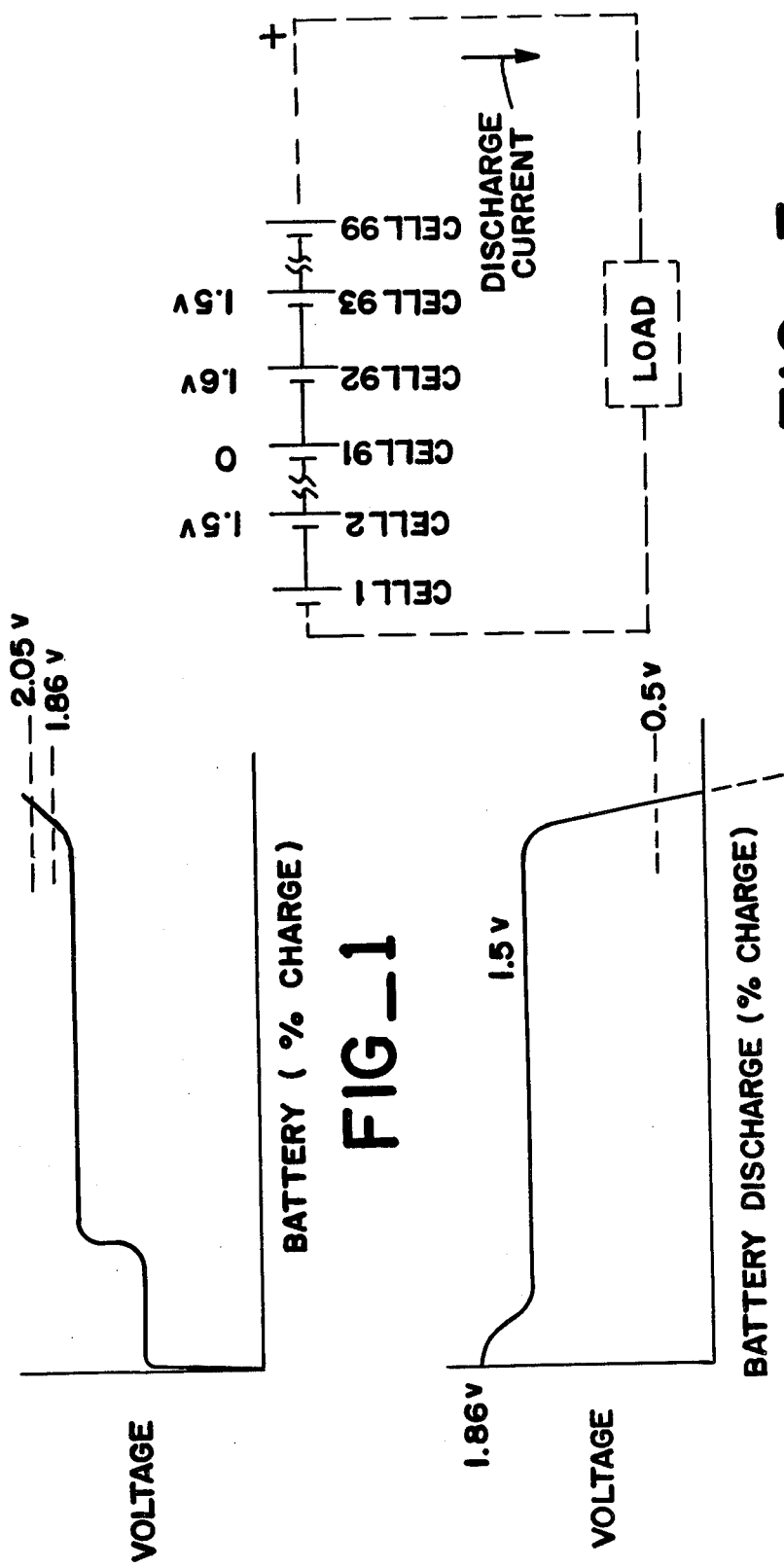

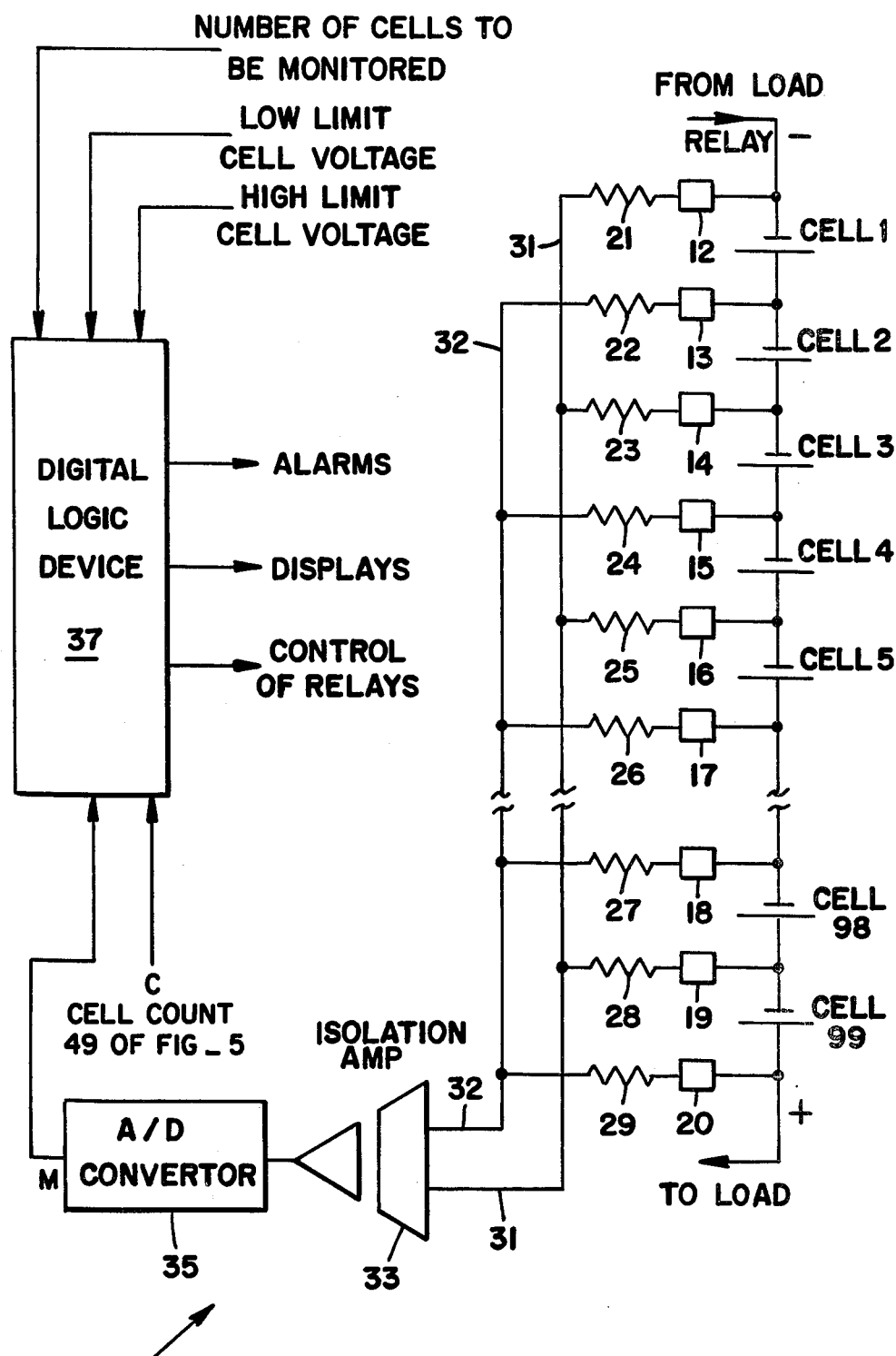
FIG_4

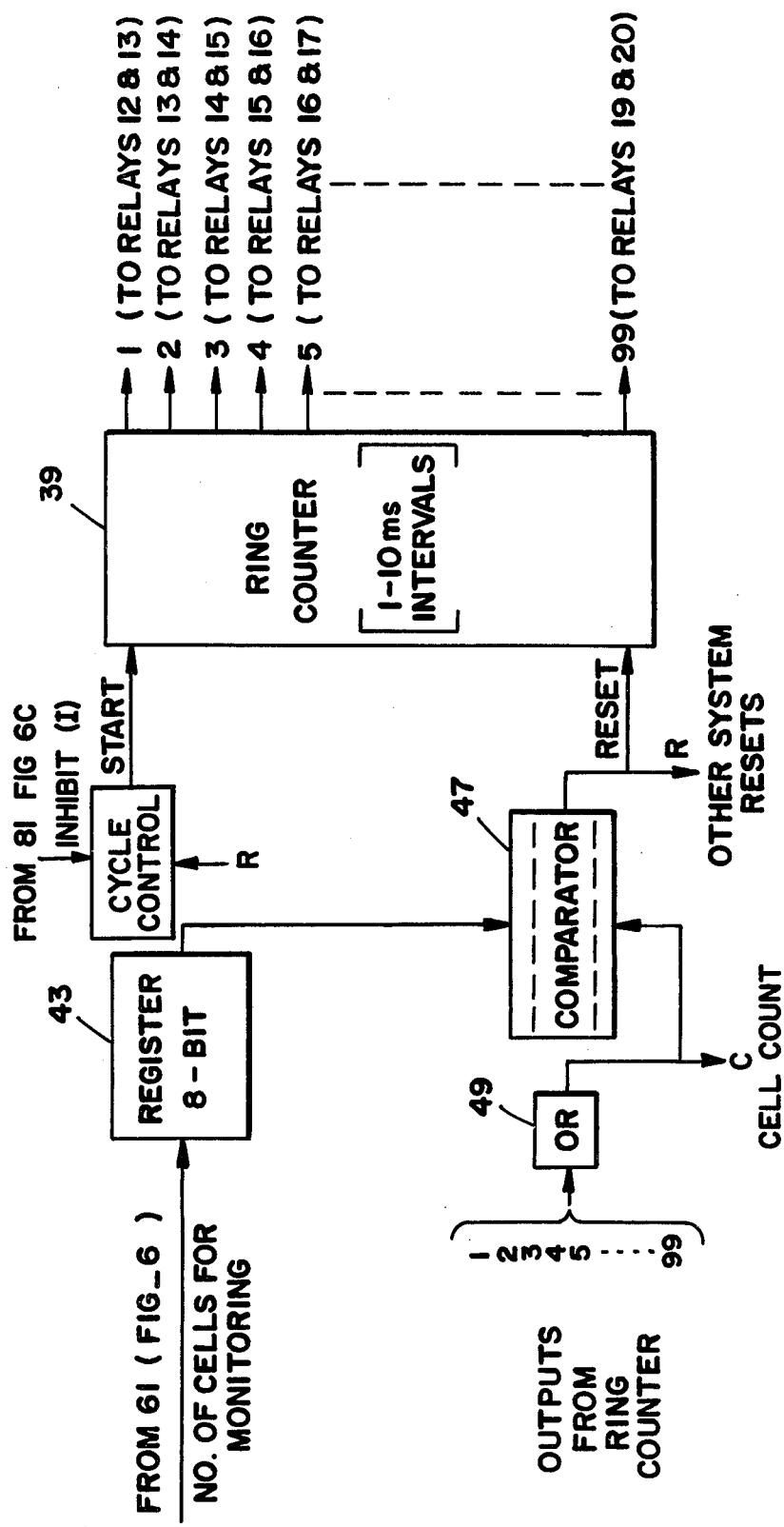
FIG_5

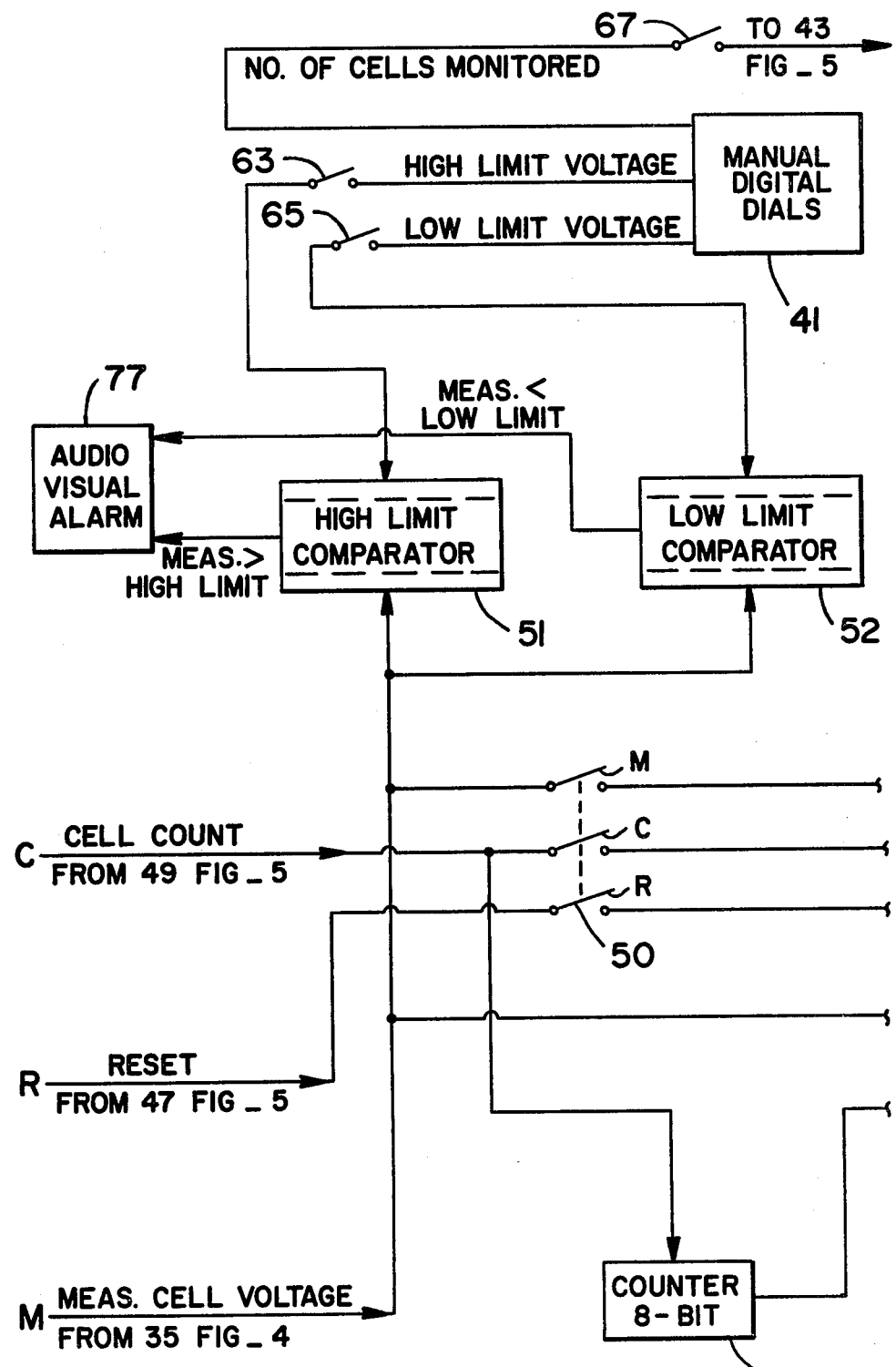
FIG _ 6A

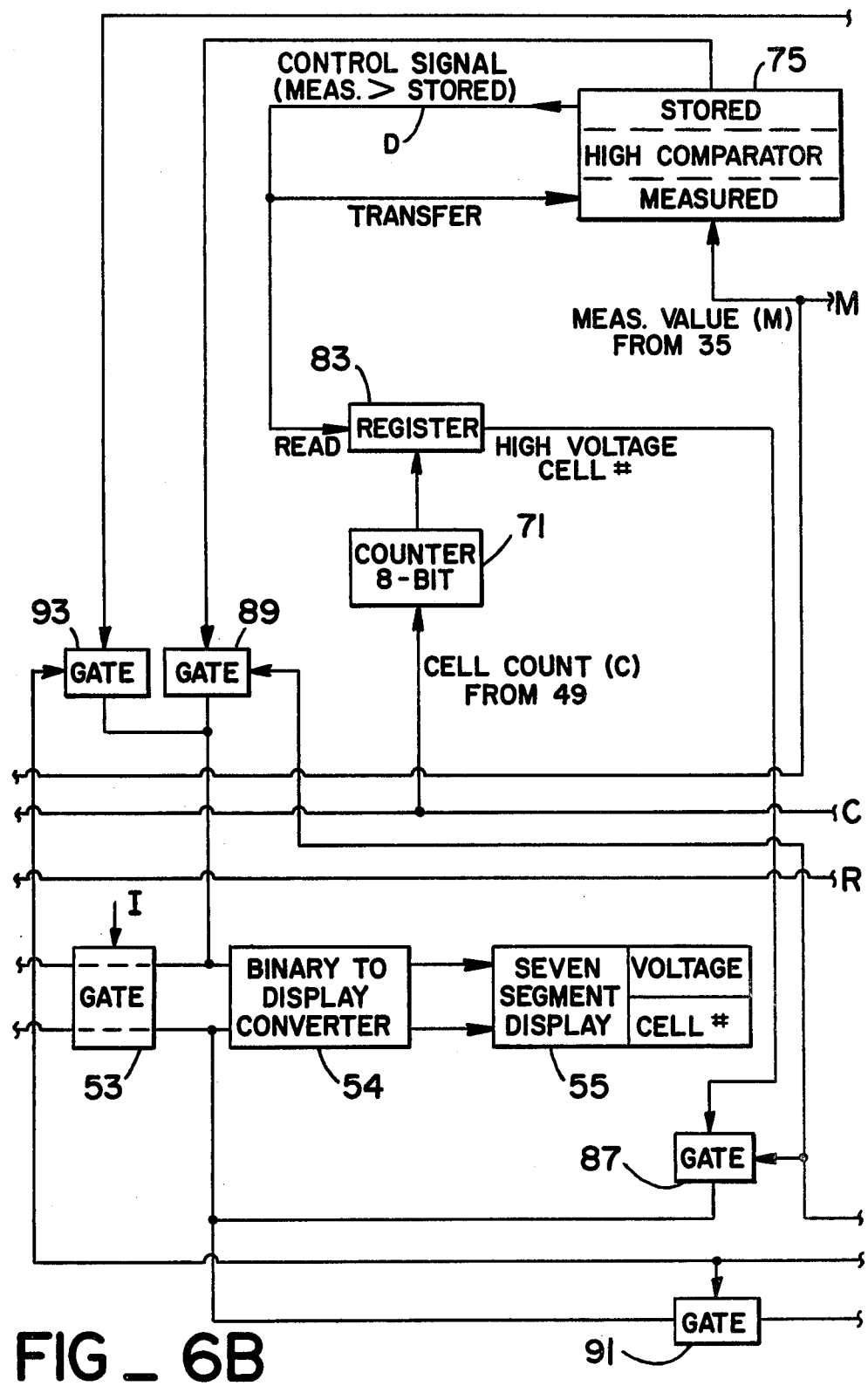
FIG_6B

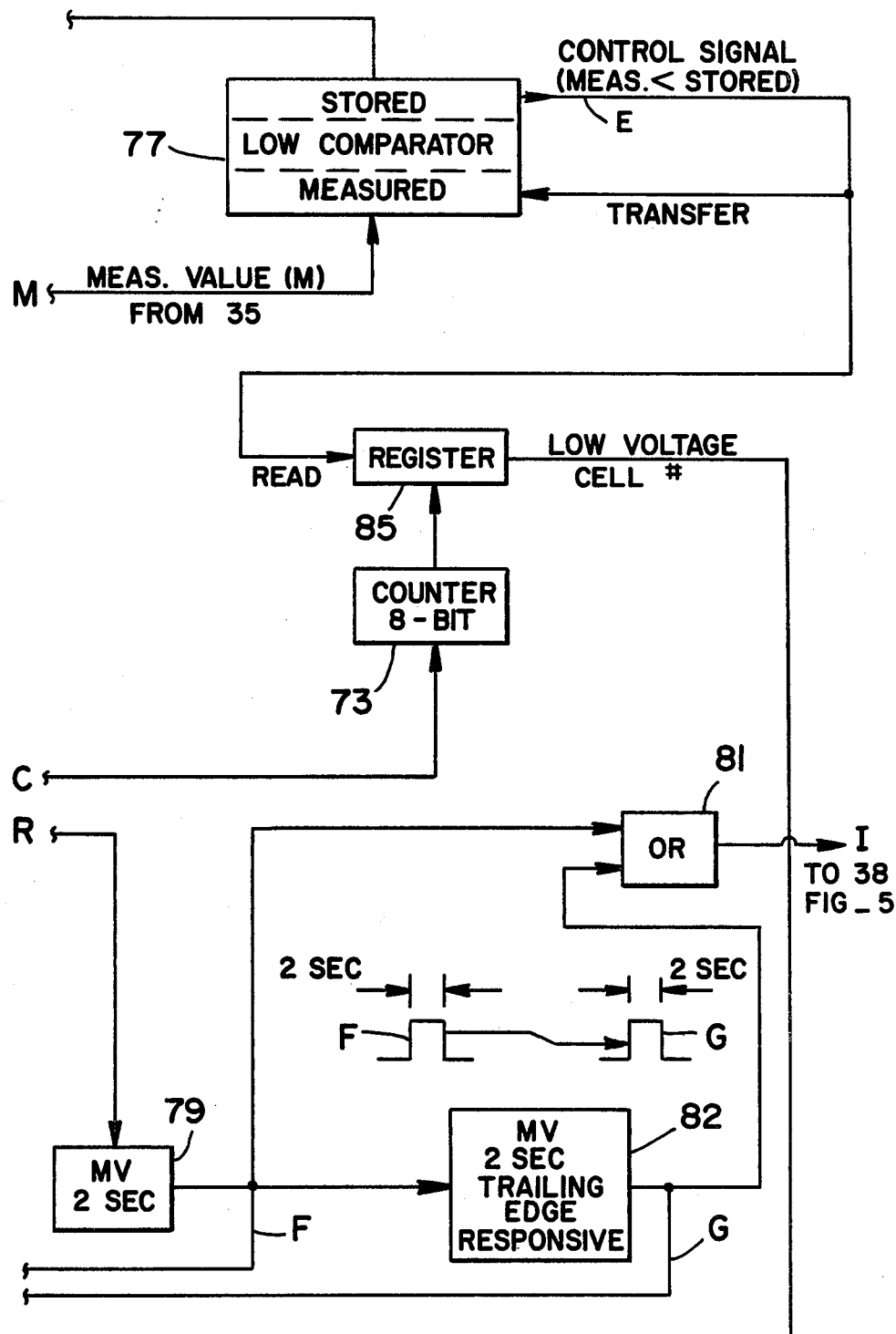
FIG_6C

BATTERY SCANNING SYSTEM

BACKGROUND OF THE INVENTION

1. Field of the Invention.

The present invention relates to a battery scanning system and more particularly to a battery scanning system that determines the voltage level of the highest and lowest cells and generates an alarm if any cell does not fall within predetermined limits.

2. Description of the Prior Art.

There are two methods commonly used to measure the cell voltages of a battery. The oldest and most commonly used method requires that the individual servicing the battery periodically measures each cell individually with a voltmeter. Many measurements are required during charging or discharge testing to ensure that the battery cells do not exceed their safe cut-off limits. Another method used to measure the cells of a battery consists of a relatively large computer which controls several instruments. An expensive digital voltmeter must be used in this type of system to provide the required measurements and voltage isolation. The digital voltmeter uses very elaborate shielding techniques which isolates the input section from the output section and all information is transferred digitally across the isolation portion of the instrument.

In general, prior techniques for monitoring battery cell voltages have either been very slow or very expensive. The present invention overcomes these problems by providing a battery scanning system that is very fast, reliable and inexpensive.

SUMMARY OF THE INVENTION

Briefly, the present invention comprises a battery scanning system which is capable of monitoring and displaying the voltage of each cell in a battery or upon command provides the cell voltage distribution by displaying the cell number and voltage values of the highest and lowest cells. The system has a digital logic system, display, input switches for operator generated variables, an alarm, relays, relay selection gates, an optically coupled isolation amplifier, power source and an analog/digital converter. The optically coupled analog amplifier electrically isolates the system from the battery so that large voltage offsets will not adversely affect the automatic measurement of cells.

STATEMENT OF THE OBJECTS OF THE INVENTION

An object of the present invention is to provide a battery scanning system that is rapid, reliable and inexpensive.

Another object of the present invention is to provide a battery scanning system that is completely automatic.

Still another object of the present invention is to provide a battery scanning system that detects anomalies quickly and generates an alarm before an unsafe condition can materialize.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a typical curve for the charging of a silver zinc battery cell which has characteristics similar to other types of cells;

FIG. 2 is a typical curve for the discharging of a silver zinc battery cell which has characteristics similar to other types of cells;

FIG. 3 generally illustrates the conditions where undersirable reverse charging will occur;

FIG. 4 is a schematic diagram of the overall bettery scanning system of the present invention;

FIG. 5 is a logic diagram of the elements used to activate the various relays of FIG. 4;

FIG. 6A, 6B, 6C show the digital logic used to monitor the cells of FIGS. 4 and 5.

DESCRIPTION OF THE PREFERRED EMBODIMENT in FIG. 1 is shown a typical characteristic curve for charging a battery cell. The maximum amount of charging is 2.05 volts for silver oxide-zinc cells, for example. This is the maximum permissible charging voltage because charging above this voltage results in rapid deterioration of the cell by oxygen generation which attacks the cellulose separators.

FIG. 2 is shown a typical characteristic curve for discharging a battery cell. The minimum discharge voltage is about 0.5 volt for silver oxide-zinc cells. Operation above this value assures that cell reversal (reverse charging of the cell by other cells in the battery) does not occur. Cell reversal occurs when the cell voltage is below zero as shown by the dotted line. Cell reversal generates hydrogen and transfers (plates) the zinc onto the silver electrode. This plating decreases the storage capacity of the battery and the hydrogen causes an explosive hazard. The 0.5 volt discharging value is selected because the FIG. 2 discharge curve is very steep and reversal will occur very rapidly in this region. FIG. 3 shows a typical situation where this reversal will occur to cell 91 during the discharge process. A typical large battery can have in excess of a hundred cells.

In FIG. 4 is schematically illustrated the overall battery scanning system 11 of the present invention. This system includes a plurality of battery cells 1-99, for example, to be monitored under charging or discharging conditions. A plurality of relays 12-20 and current limiting resistors 21-29 are applied across the cells 1, 2, 3, 4, 5 - - - 98,99 as shown. The outputs of the cells are applied to bus bars 31 and 32. As will be hereinafter explained, the cells are sequentially applied to bus bars 31 and 32 by proper activation of the relays as shown in FIGS. 4 and 5. Bus bars 31 and 32 are applied to the inputs of isolation amplifier 33. Amplifier 33 is preferably an optically coupled analog amplifier which electrically isolates the system from the battery so that large voltage offsets (cell 99 will be about 200 volts above ground) will not adversely affect the automatic measuring of the cells. The output of amplifier 33 is applied to the input of analog/digital converter 35. The outputs of the converter are applied to the digital logic microprocessor device 37. The other inputs to logic device 37 are the high limit cell voltage, the low limit cell voltage, and the number of cells to the monitored. These three parameters are selected by the operator, by a digital thumb wheel, for example, and loaded into the appropriate registers or memories as shown in FIGS. 5 and 6A, 6B and 6C. The outputs of digital logic device 37 are to alarms, displays, and the selection relays as illustrated in FIGS. 5 and 6A, 6B and 6C.

In FIG. 5 is illustrated the logic used for activating relays 1–99 of FIG. 4. A cycle control 38 is used which includes a manual power start switch, and conventional clock, gating, reset and inhibit circuits for controlling the start signal input to ring counter 39. This logic employs an 8-bit, for example, digital signal selectted by manual dials 41 (digital thumbwheels, for example) of FIG. 6A that is loaded into 8-bit, for example, register 43 of FIG. 5. The number set by dial 41 corresponds with the number of cells to be tested, in this example from 1 to 99. The output of register 43 is applied to the upper register of comparator 47. The outputs of ring counter 39 are transmitted through OR gate 49 to the add input of comparator 47 for summing in its lower register and to the input of digital logic device 37 of FIGS. 4 and 6A. In comparator 47 the cell count is compared to the number loaded from register 43. When the count numbers are equal there will be a reset signal R that is applied to various system resets including cycle control 38 and ring counter 45. Upon receipt of the reset signal, ring counter 45 will stop at the selected number of cells (for example, cell 25) and then be started again by cycle control unless an inhibit signal I is present as hereinafter explained. The system will repeat the sequential monitoring of the selected number of cells (25 in this example) until manually stopped or until the binary number loaded into register 43 is changed.

In FIGS. 6A, 6B and 6C is shown the digital logic used to monitor the cells that are selected by the logic of FIG. 5. The M output of A/D converter 35 of FIG. 4 (which is an 8-bit binary representation of the measured voltage (M) of the particular cell being monitored) is applied to the inputs of comparators 51 and 52, to switch M of triple gang switch 50, and to one of the inputs of nomrally open gate 53. The output of gate 53 is applied to the input of a conventional binary to display converter 54. Converter 54 conditions the binary signal into a signal suitable for use in seven segment display 55 to which it is applied for displaying the cell voltage being measured. As shown in FIG. 6A the output signal C from OR gate 49 of FIG. 5 is applied to the input of counter 56 and to switch C of triple gang switch 50. The output of counter 56 is connected through the other input of normally open gate 53, through converter 54 to the cell display of seven segment display 59. It should be noted that signals will be transferred through normally open gate 53 only when the inhibit signal I is not present. The input signals to gate 53 will not be transferred when the inhibit signal I is present as hereinafter described.

Manual digital dials 41 are used to select the cell high limit voltage, the cell low limit voltage, and the number of cells being tested. Manual dials are respectively connected through switches 63, 65 and 67 to the upper register of high limit comparator 51, to the upper register of low limit comparator 52 and to register 43 (number of cells to be tested) of FIG. 5 as previously explained. The high limit voltage value (an 8-bit binary representation of 2.05 volts, for example) is loaded into the upper register of high limit comparator 51 and is compared to the measured cell voltage value loaded into the lower register of comparator 51. If the measured value is greater than the high limit value (meas.->high limit), an output is provided that activates audio-visual alarm 77. The low limit voltage value (an 8-bit representation of 0.5 volts, for example) is loaded into the upper register of low limit comparator 52 and is compared to the measured cell voltage value loaded into the lower register of comparator 52. If the measured value is less than the low limit value (meas.<low limit) an output is provided that activates audio-visual alarm 77. The foregoing operation is the alarm/display mode of operation or the first mode of operation. That is, in the first mode of operation there is a display of each measured cell number and its voltage in display 55 of FIG. 6B and there will be an output from audio-visual alarm 77 of FIG. 6A if the voltage of the measured cell is above or below predetermined limits.

The second mode of operation is instituted upon closure of switch 50 of FIG. 6A which places the system in both the alarm/display mode (first mode of operation) and in the high and low cell voltage display mode. In the second mode the initial scanning of the cells is displayed as in the first mode but then the system is stopped or inhibited (by inhibit signal I applied to cycle control 38 of FIG. 5) and the highest voltage and corresponding cell number are displayed for a predetermined time (for example, 2 seconds) and then the lowest voltage and corresponding cell number are displayed for a predetermined time (for example, 2 seconds). Then the second mode of operation cycle is repeated. When switch 50 is closed the cell count signal (C) is applied to counter 71 of FIG. 6B and counter 73 of FIG. 6C. When switch 50 is closed the measured cell voltage signal (M) is applied to the lower register of high comparator 75 and to the lower register of low comparator 77. Also when switch 50 is closed the reset signal R is applied to the input of multivibrator 79 of FIG. 6C. It should be noted, however, that reset signal R will occur only after all of the cells have been measured and their voltages and corresponding cell numbers displayed on display 55. After this occurs then comparator 47 of FIG. 5 provides a reset signal R that is applied to the input of multivibrator 79, that generates an inhibit signal I from OR gate 81 of about 4 seconds duration as hereinafter explained. The inhibit signal I is applied to gate 53 of FIG. 6B, which closes gate 53, and is also applied to cycle control 38 of FIG. 5 to prevent a start signal from being applied to ring counter 39 as long as the inhibit signal I is present. During the time the inhibit signal I is present the system is stopped and the highest cell voltage and corresponding cell number are displayed on display 55 (2 seconds, for example) and then the lowest cell voltage and corresponding cell number are displayed on display 55 (2 seconds, for example).

During the second mode of operation the measured cell voltage (m) is applied to the lower register of high comparator 75 of FIG. 6B. A control signal D occurs when the measured voltage is greater than the stored voltage. The control signal is connected to the transfer input of high comparator 75 and to the read input of register 83. This will cause the measured value in the lower register to be transferred to the upper register and will cause register 83 to be loaded with the cell number in counter 71 (which cell number corresponds to the voltage now stored in the upper register of high comparator 75). During the second mode of operation the measured cell voltage (M) is also applied to the lower register of low comparator 77 of FIG. 6C. A control signal E occurs when the measured voltage is less than the stored voltage (which is initially set at a maximum value). The control signal E is connected to the transfer input of low comparator 77 and to the read input of register 85. This will cause the measured value in the lower register to be transferred to the upper register and will cause register 85 to be loaded with the cell number in counter 73 (which cell number corresponds to the voltage now stored in the upper register of low comparator 77. This process will continue for the entire cell scan cycle (for example, 25 cells). During this scan cycle the first mode is being performed. At the end of the scan cycle the voltage of the highest voltage cell will be stored in the upper register of comparator 75 and the corresponding cell number will be stored in register 83. In addition, the voltage of the lowest voltage cell will be stored in the upper register of comparator 77 and the corresponding cell number will be stored in register 85.

At the end of the scan cycle comparator 47 of FIG. 5 provides a reset signal R. This signal is applied to the input of multivibrator 79 that generates an output signal F that is applied to gate 87 and gate 89 of FIG. 6B and to the input of OR gate 81 of FIG. 6C. The output of OR gate 81 is an inhibit signal I (during signal F) that is applied to the inhibit input of cycle control 38 of FIG. 5. This inhibits the application of the start signal to ring counter 39 during the presence of signal F. The actuation of gate 87 of FIG. 6B results in the cell number stored in register 83 (representing the number of the highest voltage cell) being applied to the input of converter 54 and being displayed on display 55 during the two second output duration of the signal F from multivibrator 79. The actuation of gate 89 of FIG. 6B results in the voltage stored in the upper register of comparator 75 (representing the highest cell voltage) being applied to the input of converter 54 and being displayed on the display 55 during the two second output duration of the signal F from multivibrator 79.

Signal G is initiated by the trailing edge of signal F. Signal G is applied to gate 91 and to gate 93 of FIG. 6B and to the input of OR gate 81 of FIG. 6C. The output of OR gate 81 is an inhibit signal I (during signal G) that is applied to the inhibit input of cycle control 38 of FIG. 5. This stops the operation of ring counter during the presence of signal G from multivibrator 82. The actuation of gate 91 of FIG. 6B results in the cell number stored in register 85 (representing the number of the lowest voltage cell) being applied to the input of converter 54 and being displayed on display 55 during the two second output duration of the signal G. The actuation of gate 93 of FIG. 6B results in the voltage stored in the upper register of comparator 77 (representing the lowest cell voltage) being applied to the input of converter 54 and being displayed on the display 55 during the two second output duration of signal G from multivibrator 82.

From this it can be seen that in the second mode of operation after a full cycle on cell measurements have been made, displayed and alarm sounded, if necessary, then the system stops and displays the high voltage and corresponding cell for a sufficient period of time for visual observation, for example, 2 seconds, and then displays the low voltage and corresponding cell for visual observation for 2 seconds, for example. The process then repeats.

From this it can be seen that the process is changed from the second mode to the first mode (which excludes the second mode) by opening switch 50 of FIG. 6A and the process is changed to the second mode (which includes the first mode) by closing switch 50.

What is claimed is:

1. A battery scanning system comprising:
   (a) voltage connecting means for individually connecting across the voltage terminals of each of a plurality of battery cells, said voltage connecting means including
      (1) a plurality of relays, said plurality of relays being connected to said plurality of cells so that each of said plurality of cells is connected between two of said plurality of relays,
      (2) a plurality of load resistors, one of said load resistors connected in series with one of said plurality of relays,
      (3) a positive load line, said positive load line being connected to the positive terminal of each of said cells via one of said load resistors and one of said relays, and
      (4) a negative load line, said negative load line being connected to the negative terminal of each of said cells via one of said load resistors and one of said relays;
   (b) an isolation amplifier, the input of said isolation amplifier connected to the output of said voltage connecting means;
   (c) an analog to digital converter, the output of said isolation amplifier connected to the input of said analog to digital converter; and
   (d) a digital logic device including a cell selector means for sequentially selecting a predetermined number of cells, a high limit means for determining when a cell has a voltage that is greater than a predetermined high limit and a low limit means for determining when a cell has a voltage that is less than a predetermines low limit;
   (e) said cell selector means including
      (1) a ring counter means having a start input and a reset input;
      (2) a comparator;
      (3) cell number means for selecting the number of cells to be monitored,
      (4) means for loading the output of said cell number means in said comparator and for starting said ring counter;
      (5) means for connecting the individual sequential output of said ring counter to activate the relays associated with each cell sequentially;
      (6) means for summing the outputs of said ring counter and comparing the sum to the number of cells loaded into said comparator, said comparator providing a reset output when the sum of said ring counter outputs equals the load value; and
      (7) means for applying said reset output from said comparator to the reset input of said ring counter.

2. The system of claim 1 wherein:
   (a) said isolation amplifier is an optically coupled isolation amplifier that is capable of isolating offset voltages of the order of more than a hundred volts.

3. The system of claim 1 wherein:
   (a) said high limit means comprises a high limit comparator including upper and lower registers;
   (b) the output of said analog to digital converter connected to the input of said lower register, a high limit means for loading a high voltage limit in said upper register;
   (c) said comparator providing a high indicator output signal when the value in said lower register is greater than the value in said upper register;
   (d) an alarm device; and (e) said output signal connected to the input of said alarm device.

4. The system of claim 3 wherein:
(a) said low limit means comprises a low limit comparator including upper and lower registers;
(b) the output of said analog to digital converter connected to the input of said lower register, a low level means for loading a low level voltage limit in said upper register;
(c) said comparator providing a low indicatator output signal when the value in said lower register is lower than the value in said upper register; and
(d) said output signal connected to the input of said alarm device.

5. The system of claim 1 including:
(a) display means including a cell voltage display and a cell number display;
(b) a counter for counting the number of cells monitored and means for displaying each number in said counter on said number display;
(c) said analog to digital converter the voltage of each cell to a binary number; and
(d) means for displaying each voltage of each cell on said cell voltage display.

6. The system of claim 1 including:
(a) means for indicating the highest voltage cell of the cells monitored and the lowest voltage cell of the cells monitored.

7. The system of claim 6 including:
(a) means for making a single scan of said predetermined number of cells;
(b) high means for displaying for a first predetermined time the value of the highest cell voltage and the cell number of the cell having said highest cell voltage; and
(c) low means for displaying for a second predetermined time the value of the lowest cell voltage and the cell number of the cell having said lowest cell voltage.

8. The system of claim 7 wherein:
(a) the time sequence of operation is that said single scan is initially performed; then said high means displays; and then said low means displays.

* * * * *